United States Patent [19]
Nakano

[11] Patent Number: 4,538,166
[45] Date of Patent: Aug. 27, 1985

[54] SEMICONDUCTOR MEMORY DEVICE

[75] Inventor: Motoo Nakano, Yokohama, Japan

[73] Assignee: Fujitsu Limited, Kawasaki, Japan

[21] Appl. No.: 571,639

[22] Filed: Jan. 17, 1984

Related U.S. Application Data

[63] Continuation of Ser. No. 220,967, Dec. 29, 1980, abandoned.

[30] Foreign Application Priority Data

Dec. 29, 1979 [JP] Japan .................................. 54-171195

[51] Int. Cl.³ .................... H01L 29/78; H01L 27/02; H01L 29/04
[52] U.S. Cl. ............................... 357/23.6; 357/23.11; 357/41; 357/59; 365/149; 365/182
[58] Field of Search .................. 357/23, 52, 59, 41; 365/182, 149

[56] References Cited

U.S. PATENT DOCUMENTS

| T964,009 | 11/1977 | Chiu et al. | 357/53 |
|---|---|---|---|
| 3,387,286 | 6/1968 | Dennard | 365/182 |
| 3,811,076 | 5/1974 | Smith | 357/41 |
| 4,095,251 | 6/1978 | Dennard et al. | 357/23 C |
| 4,115,871 | 9/1978 | Varadi | 357/41 |
| 4,164,751 | 8/1979 | Tasch, Jr. | 357/41 |
| 4,262,298 | 4/1981 | Tuan et al. | 357/23 C |

OTHER PUBLICATIONS

Dennard et al., "Self-Aligned Field Shield Process", IBM Technical Disclosure Bulletin, vol. 16, (7/73), pp. 507-508.
"Alpha Particles May Be Cause of Soft Errors in Memory", Electronic Design, vol. 26, (5/78), p. 37.

Primary Examiner—Gene M. Munson
Attorney, Agent, or Firm—Staas & Halsey

[57] ABSTRACT

A 1-transistor and 1-capacitor type memory cell includes a first capacitor electrode and a field shield electrode which serves as the second capacitor electrode of the memory cell. A high impurity concentration layer is formed just beneath the first electrode of the capacitor of the memory cell and extends to a field region to form a channel stop area. However, the high impurity concentration layer is inhibited from extending to the transistor gate. This arrangement provides so-called 1-transistor and 1-capacitor type memory cells which are highly integrated, have a long persisting time and are resistant to alpha rays.

6 Claims, 20 Drawing Figures

SEMICONDUCTOR MEMORY DEVICE

This application is a continuation of application Ser. No. 220,967, filed Dec. 29, 1980, now abandoned.

BACKGROUND OF THE INVENTION

This invention relates to a semiconductor memory device, more particularly to an improvement applicable to a semiconductor memory device comprising a plurality of so-called 1-transistor and 1-capacitor type memory cells.

In the prior art, a so-called channel stop system is employed for isolating the memory cells from each other. Namely, each memory cell is surrounded by a high impurity concentration area which is called a channel stop area, selectively formed in a surface portion of a semiconductor substrate. To keep self alignment for each layer of a semiconductor memory cell, the channel stop process available in the prior art comprises a step of covering the active area, including transistor area of a memory cell, with a mask of silicon nitride, a step of selectively introducing an impurity into an area uncovered by the mask, and a step of growing a thick field silicon oxide layer except on the mask.

From a practical viewpoint, however, the conventional channel stop process using a thick field oxide layer, inevitably has a drawback in that the area of the active area is unintentionally decreased, because the field silicon oxide layer is inclined to grow toward the active area and a lengthy heat treatment causes the impurity doped for the purpose of the channel stop system to diffuse toward the active area.

It is quite natural that a capacitor formed with a silicon oxide layer grown on a substrate and a conductive layer, grown on the silicon oxide layer and a high impurity concentration layer doped beneath the silicon oxide layer spreading beneath the high impurity concentration layer at an interface or p-n junction formed between the substrate and the high impurity concentration layer, is useful to decrease the size of the capacitor for the memory cell. To increase the capacitance of the latter capacitor, for reducing the capacitor size, another high impurity concentration layer with the same conductivity as that of the substrate is interleaved between the first high impurity concentration layer and the substrate.

This method, however, has a drawback in that the above mentioned additional high impurity concentration layer with the same conductivity as that of the substrate, reaches the gate of a transfer gate transistor, thereby increasing the threshold voltage Vth of the same transistor.

Further, in order to prevent the inversion of conductivity from occuring at the surface of the substrate in the field area, a so-called field shield system can be employed rather than some of the conventional means used for the same purpose, such as the channel stop system. This field shield system, however, has a drawback in that it tends to cause a lesser degree of circuit integration, due to the additional masking process required to form the pattern of the field shield layer. Moreover, unlike the channel stop diffusion system, the field shield system is ineffective to prevent the surface inversion originated from the characteristics of the insulator layer thereunder.

SUMMARY OF THE INVENTION

An object of this invention is to provide a semiconductor memory device which is highly integrated.

Another object of this invention is to provide a semiconductor memory device having a long persisting time (memory holding time).

A further object of this invention is to provide a semiconductor memory device with a plane surface and which is resistant to alpha.

To attain the above mentioned objects, a semiconductor memory device in accordance with this invention is provided with a capacitor formed by (a) an insulator layer grown on a substrate having one conductivity, (b) a conductive layer grown on the insulator layer to provide one electrode of a capacitor of the memory device, extending to a field region to form a field shield layer, (c) a first semiconductor layer highly doped to the conductivity opposite to that of the substrate, located beneath the insulator layer to provide the other electrode of the capacitor and the source of the transfer gate transistor and (d) a second semiconductor layer highly doped to the conductivity identical to that of the substrate, located beneath the first highly doped semiconductor layer mentioned above and extending toward the field region but not toward the gate region of the transfer gate transistor. The memory device of the present invention serves three independent purposes including (i) an increase in capacitance, (ii) isolation of the capacitor from the gate of a transfer gate transistor and (iii) channel stop.

BRIEF DESCRIPTION OF THE DRAWINGS

My invention, together with its various features and advantages, can be readily understood from the following more detailed description presented in conjunction with the following drawings, in which:

FIG. 2 (b) is a plan view of FIG. 2 (a);

FIG. 6 (b) is a plan view of FIG. 6 (a);

FIG. 11 (b) is a schematic cross-sectional view of FIG. 11 (a) taken along the line X-Y;

FIG. 11 (c) is a schematic cross-sectional view of FIG. 11 (a) taken along the line X'-Y';

DESCRIPTION OF THE PREFERRED EMBODIMENTS

With reference respectively to FIGS. 1 through 11 and FIGS. 12 through 16, the steps for production of and the arrangement and configuration of two independent embodiments in accordance with this invention will be described below.

With reference to FIGS. 1 through 10, the steps for production of a semiconductor memory device in accordance with one embodiment of this invention are described for a case in which the semiconductor memory device is produced on a p-doped silicon substrate.

Figure 1:
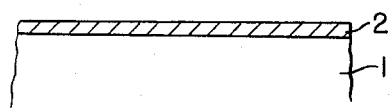
FIG. 1 is a cross-sectional view of a semiconductor wafer after a first step for production of a semiconductor memory cell in accordance with one embodiment of this invention.

Referring to FIG. 1, the first step is to grow a silicon dioxide layer (2) with a thickness of, for example, 200–400 angstroms on a p-doped silicon substrate (1). Any suitable process can be used for this purpose. The silicon dioxide layer (2) functions as a dielectric layer for a capacitor and a field insulator layer. Depending on specific conditions, a double layer consisting of a silicon dioxide layer and a silicon nitride layer is preferable.

Figure 2A:
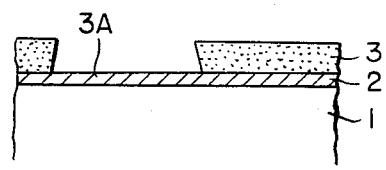
FIG. 2 (a) is a cross-sectional view of a semiconductor wafer after a second step for production of a semiconductor memory cell in accordance with one embodiment of this invention.
Figure 2B:
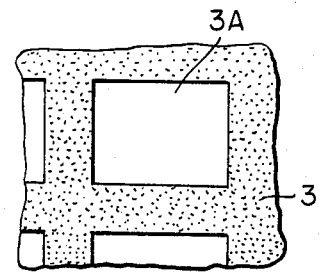

Referring to FIGS. 2 (a) and (b), an ordinary lithography process is employed for production of an opening (3A) in a resist film (3) which is coated with the approximate thickness of 1 μm on the silicon oxide layer (2).

Figure 3:
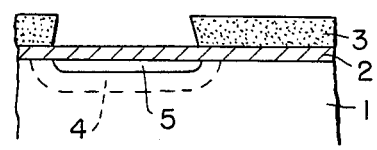
FIG. 3 is a cross-sectional view of a semiconductor wafer after a third step for production of a semiconductor memory cell in accordance with one embodiment of this invention.

Referring to FIG. 3, an ion implantation process is employed for production of P+ region (4) and thereafter N+ region (5) in the P-doped substrate (1). As shown in the figure, the dimension of the former region is larger than that of the latter. The dopants for each process are respectively, for example, boron and arsenic.

Figure 4:
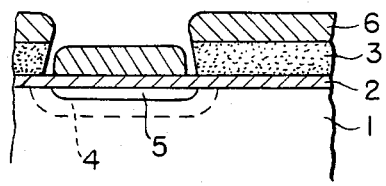
FIG. 4 is a cross-sectional view of a semiconductor wafer after a fourth step for production of a semiconductor memory cell in accordance with one embodiment of this invention.

Referring to FIG. 4, a second mask (6) is produced on the entire surface of the wafer. The material of the mask (6) must be different from that of the resist mask (3). The material may be aluminum. In this case, evaporation is a convenient method for production of this mask film.

Figure 5:
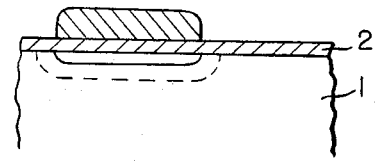
FIG. 5 is a cross-sectional view of a semiconductor wafer after a fifth step for production of a semiconductor memory cell in accordance with one embodiment of this invention.

Referring to FIG. 5, a so-called lift off process is employed for removing the resist film (3), so that the other mask (6) remains.

Figure 6A:
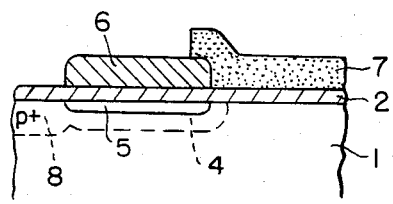
FIG. 6 (a) is a cross-sectional view of a semiconductor wafer after a seventh step for production of a semiconductor memory cell in accordance with one embodiment of this invention.
Figure 6B:
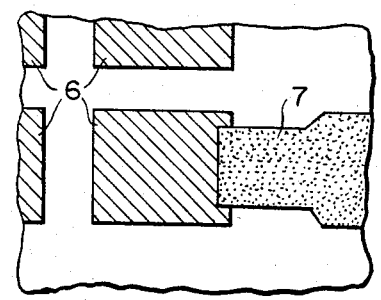

Referring to FIGS. 6 (a) and (b), a third mask film (7) is produced selectively on the active area except the capacitor area, as shown in FIG. 6 (b). This area corresponds to the transistor area. As a result, only the field area remains uncovered by masks.

An ion implantation process is employed for introducing P-ions, for example boron ions, to the entire surface of the wafer. As a result, a channel stop region (8) is produced beneath the silicon dioxide layer (2) for the purpose of isolating the memory cells from each other. It should be noted that this channel stop region (8) is connected with P+ region (4) produced in the capacitor area.

Figure 7:
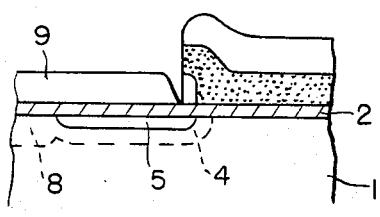
FIG. 7 is a cross-sectional view of a semiconductor wafer after a tenth step for production of a semiconductor memory cell in accordance with one embodiment of this invention.

Referring to FIG. 7, the second mask (6) is removed. The figure shows that a portion of the removed second mask (6) remains under the third mask film (7).

An evaporation process is employed to produce a polycrystal silicon layer (9) with a thickness of, for example, 2,000 through 3,000 angstroms on the entire surface of the wafer.

An ion implantation process is employed to introduce a P- or N-type impurity into the polycrystal silicon layer (9) for the purpose of reducing the electric resistance thereof.

Figure 8:
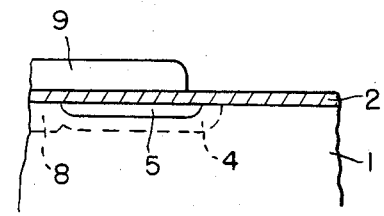
FIG. 8 is a cross-sectional view of a semiconductor wafer after an eleventh step for production of a semiconductor memory cell in accordance with one embodiment of this invention.

Referring to FIG. 8, the third mask film (7) together with the silicon layer (9) located thereon is removed by a solvent of the resist. This is a so-called lift-off process. The remaining portion of the silicon layer (9) functions as a field shield layer and one electrode of a capacitor, when it is grounded later.

Figure 9:
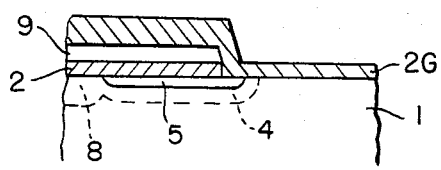
FIG. 9 is a cross-sectional view of a semiconductor wafer after a twelfth step for production of a semiconductor memory cell in accordance with one embodiment of this invention.

Hereafter, an ordinary method is employed for production of an FET on the active region. Referring to FIG. 9, the silicon dioxide layer (2) is removed from the transistor area, before another silicon dioxide layer (2G) is grown on the substrate (1). It is noted that the thickness of the above mentioned silicon dioxide layer (2G) is 1.5 times as thick on the polycrystal silicon layer (9) as on the substrate (1). Further, a process temperature of approximately 900° C. is sufficient.

Figure 10:
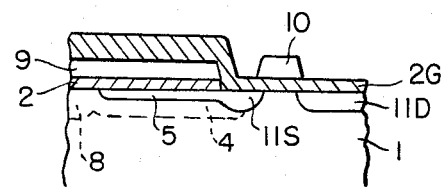
FIG. 10 is a cross-sectional view of a semiconductor wafer after a seventeenth step for production of a semiconductor memory cell in accordance with one embodiment of this invention.

Referring to FIG. 10, a silicon gate electrode (10) is produced, before an ion implantation process is employed for introduction of N-ions in a source region (11S) and a drain region (11D). Finally, an ordinary method is employed for production of one or more inter-layer insulation layers, contact holes and electrodes, thereby completing the production process.

Figure 11A:
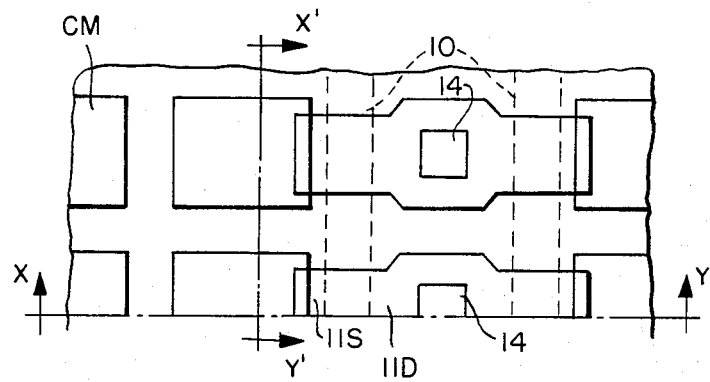
FIG. 11 (a) is a portion of a schematic plan view of a completed semiconductor memory device in accordance with one embodiment of this invention.
Figure 11B:
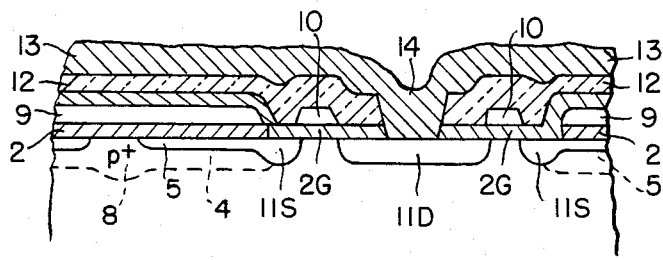
Figure 11C:
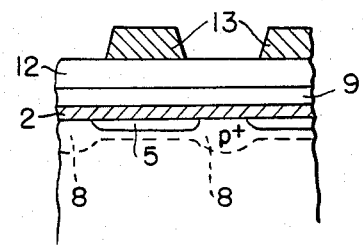

With reference to FIGS. 11 (a), (b) and (c), the arrangement and configuration of a semiconductor memory device which is one embodiment in accordance with this invention which is produced as described above, is shown. FIG. 11 (a) is a schematic plan view of the semiconductor memory device. FIGS. 11 (b) and (c) are schematic cross-sectional views of FIG. 11 (a), taken along line X-Y and line X'-Y', respectively. Reference numerals 12, 13 and 14 respectively depict a phosphosilicate glass layer, an aluminum bit line and a contact hole. Reference $C_M$ depicts a memory capacitor area. The silicon gate (10) functions as a word line.

The memory cell area and the memory capacitor area of the above-described semiconductor memory device respectively have the area of 47.5 $\mu m^2$ and 14.5 $\mu m^2$, based on the 1.5 $\mu m$ rule.

As is clear from the steps for production described above, a so-called 1-transistor and 1-capacitor type semiconductor memory device in accordance with this invention has an arrangement and configuration predominantly for its capacitor portion which comprises (a) an insulator layer grown on a semiconductor substrate having one conductivity, (b) a conductive layer grown on the insulator layer to provide one electrode of the capacitor, which continues to a field shield layer to form one unit with the field shield layer, (c) a first semiconductor layer highly doped to the conductivity opposite to that of the substrate, which is located beneath the insulator layer to provide the other electrode of the capacitor and the source for the transfer gate transistor and (d) a second semiconductor layer highly doped to the conductivity identical to that of the substrate, which is located beneath the first semiconductor layer to extend toward the field region but not toward the gate region of the transfer gate transistor.

Accordingly, a so-called 1-transistor and 1-capacitor type semiconductor memory device in accordance with this invention exhibits the results itemized below.

(a) Since a field shield layer is produced with a silicon semiconductor layer having a pattern defined by a self alignment system, the surface of the device is planar and capable of accepting a finer pattern.

(b) Since a thick silicon dioxide layer is not necessary for field insulation or isolation, no lengthy high temperature heat treatment is required. Therefore, there is no possibility for the field silicon dioxide layer to reduce the size of the active area.

(c) Since a means is provided to inhibit the depletion layer from spreading in excess of certain limits, a large capacitance can be expected for the capacitor. Further, a long persisting time or memory holding time can be expected, because the upward movement of electrons to the capacitance region from the substrate can be effectively prevented by the high impurity concentration layer.

(d) Since a larger capacitance can be expected and the upward movement of electrons can be prevented as mentioned above, the device can be resistant to alpha rays.

(e) Since the second semiconductor layer which is highly doped to the conductivity identical to that of the substrate, is isolated from the gate area, there is no possibility that the threshold voltage will be increased.

From the above detailed description, it is clear that the semiconductor memory device of the present invention is highly integrated, has a long persisting time (memory holding time), has a planar surface and is resistant to alpha rays.

In addition, with reference to FIGS. 12 through 16, the steps for production of and the arrangement and configuration of a semiconductor memory device in accordance with another embodiment of this invention will be described below, assuming that the semiconductor memory device is produced on a P-doped silicon substrate. The major difference between this embodiment and the above-described embodiment is that this embodiment includes a word line which is connected with a gate and which is overlaid on a wafer, and a bit line which is buried.

Figure 12:
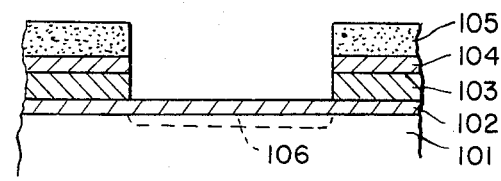
FIG. 12 is a cross-sectional view of a semiconductor wafer after a fifth step for production of a semiconductor memory cell in accordance with another embodiment of this invention.

Referring to FIG. 12, the first step is to grow a silicon dioxide layer (102) with a thickness of, for example, 500 angstroms on a P-doped silicon substrate (101). Any process can be employed for this purpose. The second step is to grow a silicon nitride layer (103) with a thickness of, for example, 3,000 through 10,000 angstroms, on the silicon dioxide layer (102) employing a plasma chemical vapor deposition process. The third step is to grow a silicon nitride layer (104) with a thickness of, for example, 1,000 through 2,000 angstroms employing a chemical vapor deposition process. The fourth step is to etch an opening in the silicon nitride layers (103) and (104) not covered by a resist film (105) employig a lithography process. The fifth step is to apply an ion implantation process to introduce boron ions into the substrate (101). The reference numeral (106) shows a P+ region produced by the boron ion implantation.

Figure 13:
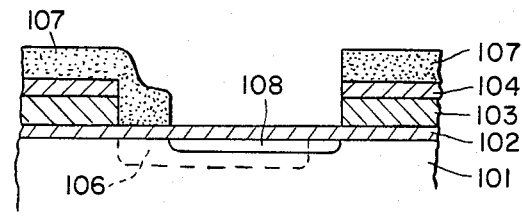
FIG. 13 is a cross-sectional view of a semiconductor wafer after a ninth step for production of a semiconductor memory cell in accordance with another embodiment of this invention.

Referring to FIG. 13, the sixth step is to remove the resist film (105) from the entire surface. The seventh step is to produce another resist film (107) employing a different mask (not shown). The eighth step is to etch a portion of the silicon nitride layers (103) and (104) uncovered by the resist film (107) by a reactive sputter etching process. The ninth step is to employ an ion implantation process to introduce arsenic ions into the substrate (101). The reference numeral (108) shows an N+ region produced by the arsenic ion implantation.

Figure 14:
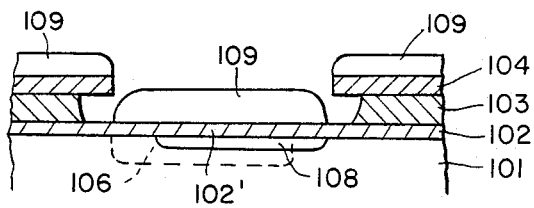
FIG. 14 is a cross-sectional view of a semiconductor wafer after a fourteenth step for production of a semiconductor memory cell in accordance with another embodiment of this invention.

Referring to FIG. 14, the tenth step is to remove the resist film (107). The eleventh step is to selectively remove a portion of the silicon nitride layers produced by a plasma deposition process and the remaining uncovered silicon dioxide layer, by a wet etching process using a mixed solution of hydrogen fluoride and ammonium fluoride which is well known as a buffer HF etching solution. In this step, the specific portions of the silicon nitride layers produced by the chemical vapor deposition process remain to form an overhanging structure, as shown in FIG. 14. The twelfth step is to produce a silicon dioxide layer (102') at the bottom of the opening. The thirteenth step is to grow an amorphous silicon layer (109) on the entire surface of the wafer. An electron gun evaporation process or a sputtering process is preferable for growing the silicon layer (109). The fourteenth step is to introduce N or P type impurity ions into the silicon layer (109).

Figure 15:
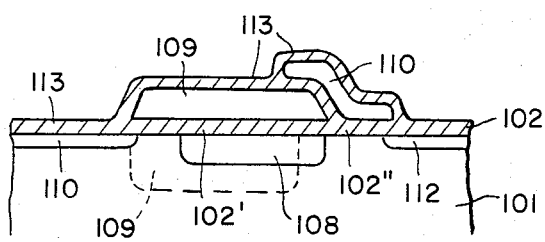
FIG. 15 is a cross-sectional view of a semiconductor wafer after a twenty-first step for production of a semiconductor memory cell in accordance with another embodiment of this invention.

Referring to FIG. 15, the fifteenth step is to immerse the wafer in hot phosphoric acid to remove the silicon nitride layers (103) and (104) together with a portion of silicon layer (109) placed thereon to carry out a lift-off process. The sixteenth step is to etch a portion of the silicon dioxide layer (102) uncovered by the silicon layer (109) for preparing a space to produce a gate of a transfer transistor. The seventeenth step is to oxidize the wafer to produce a gate insulator layer (102"). During this process, the amorphous silicon is converted to a polycrystal silicon, and boron ions and arsenic ions are activated and diffused downward, as shown in the figure. Further, P+ region is made deeper than N+ region. The eighteenth step is to grow a polycrystal silicon layer on the surface of the wafer, before a lithography process is employed for patterning gate (110) made of the polycrystal silicon layer. The ninteenth step is to etch the exposed portion of the silicon oxide layer (102) from the wafer. The twentieth step is to employ an ion implantation process for introduction of arsenic ions into the wafer for the purpose of producing source and drain regions (110) and (112) functioning as bit lines, to reduce the resistance of the polycrystal silicon electrode (109) for the capacitor. The twenty-first step is to produce a silicon oxide layer (113) on the silicon layers by a thermal oxidation process.

Figure 16:
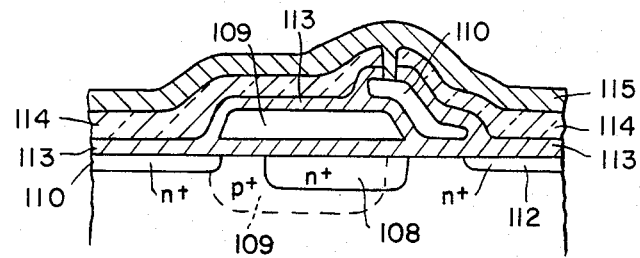
FIG. 16 is a portion of a schematic cross-sectional view of a completed semiconductor memory device in accordance with another embodiment of this invention.

Thereafter an ordinary process is employed to complete a semiconductor memory device which is another embodiment of this invention. Referring to FIG. 16, phosphosilicate glass layer (114) is grown on the wafer, a contact hole is perforated in the phosphosilicate glass layer (114), an anneal process is carried out, an aluminum layer (115) is formed on the phosphosilicate glass layer (114) and the aluminum layer (115) is patterned to form a word line.

I claim:

1. A semiconductor memory device including a plurality of memory cells, each of which comprises a transistor and a capacitor, said memory device comprising:
    a semiconductor substrate of a first conductivity type;
    an insulator layer formed on the surface of said semiconductor substrate;
    a first semiconductor region of a second conductivity type, opposite said first conductivity type, formed in said semiconductor substrate beneath said insulator layer, said first semiconductor region functioning as one electrode of the capacitor of a memory cell;
    a second semiconductor region of the first conductivity type having a first portion formed in said semiconductor substrate beneath said first semiconductor region, and having a second portion formed in said semiconductor substrate in a field area surrounding said first semiconductor region, each of said first and second portions having an impurity concentration higher than that of said semiconductor substrate, said first and second portions having different thicknesses;
    a conductive layer formed on the portion of said insulator layer covering said first and second semiconductor regions and serving as the other electrode of the capacitor and as a field shield electrode, said conductive layer having a pattern identical to that of said second semiconductor region except at the portion where the capacitor is coupled to the transistor by said first semiconductor region; and
    a gate conductor formed on said insulator layer and spaced apart from said conductive layer, said gate conductor functioning as a gate of the transistor of the memory cell;
    said first semiconductor region having first and second portions, the first portion of said second semiconductor region being located beneath the first portion of said first semiconductor region, the second portion of said first semiconductor region being located under an area between said conductive layer and said gate conductor so as to connect the first portion of said first semiconductor region to the transistor, the second portion of said first semiconductor region having a depth greater than that of the first portion of said first semiconductor region.

2. A semiconductor memory device including a plurality of memory cells, each of which comprises a transistor and a capacitor, said memory device comprising:
    a semiconductor substrate of a first conductivity type;
    a first semiconductor region of a second conductivity type opposite said first conductivity type, formed in said semiconductor substrate, said first semiconductor region including an electrode portion, functioning as a first electrode of the capacitor of a memory cell, and a coupling portion for coupling the capacitor to the transistor, the coupling portion having a depth greater than that of the electrode portion;
    a second semiconductor region of the first conductivity type having a first portion formed in said semiconductor substrate beneath the electrode portion of said first semiconductor region and having a second portion formed in said semiconductor substrate in a field area surrounding said first semiconductor region, said first and second portions having first and second impurity concentrations, respectively, both of which are higher than that of said semiconductor substrate, said first and second portions having first and second thicknesses, respectively;
    an insulator layer formed on the surface of said semiconductor substrate;
    a conductive layer formed on said insulator layer, said conductive layer serving as the second electrode of the capacitor and as a field shield electrode, said conductive layer having a pattern identical to that of said second semiconductor region except at the portion of said second semiconductor region underlying the coupling portion of said first semiconductor region; and
    a gate conductor formed on said insulator layer and spaced apart from said conductive layer, said gate conductor functioning as a gate of the transistor of the memory cell, the coupling portion of said first semiconductor region being located under an area between said conductive layer and said gate conductor so as to connect the electrode portion of said first semiconductor region to the transistor.

3. A semiconductor memory device as set forth in claim 2, wherein said first conductivity type is p-type.

4. A semiconductor memory device as set forth in claim 2, wherein said conductive layer is polycrystal silicon.

5. A semiconductor memory device as set forth in claim 4, wherein said insulator layer comprises silicon dioxide.

6. A semiconductor memory device as set forth in claim 4, wherein said insulator layer comprises a silicon dioxide layer and a silicon nitride layer.

* * * * *